(12) United States Patent
Puccio et al.

(10) Patent No.: US 7,158,600 B2
(45) Date of Patent: Jan. 2, 2007

(54) CHARGE PUMP PHASE LOCKED LOOP

(75) Inventors: Gianni Puccio, Cagnes-sur-Mer (FR); Biagio Bisanti, Antibes (FR); Stefano Cipriani, Golfe Jan (FR)

(73) Assignee: Texas Instruments Incorporated, Dallas, TX (US)

( * ) Notice: Subject to any disclaimer, the term of this patent is extended or adjusted under 35 U.S.C. 154(b) by 530 days.

(21) Appl. No.: 10/154,684

(22) Filed: May 24, 2002

(65) Prior Publication Data
US 2003/0189991 A1 Oct. 9, 2003

(30) Foreign Application Priority Data
Apr. 4, 2002 (EP) .................... 02290841

(51) Int. Cl.
*H03D 3/24* (2006.01)
(52) U.S. Cl. ............... 375/376; 375/374; 327/157; 327/148
(58) Field of Classification Search ......... 375/373, 375/326, 374, 375, 376; 329/360; 342/103; 332/127; 388/911; 455/180.3; 327/147, 327/157, 148; 324/76.53
See application file for complete search history.

(56) References Cited
U.S. PATENT DOCUMENTS 4,987,387 A * 1/1991 Kennedy et al. ............ 331/1 A
5,095,287 A * 3/1992 Irwin et al. ................. 331/1 A
5,315,269 A * 5/1994 Fujii ........................... 331/1 A
6,223,061 B1 * 4/2001 Dacus et al. ................ 455/574
6,963,233 B1 * 11/2005 Puccio et al. ............... 327/157

FOREIGN PATENT DOCUMENTS

| EP | 0 416 840 A2 | 3/1991 |
| EP | 0 855 802 A2 | 7/1998 |
| JP | 5-183431 | 7/1993 |

* cited by examiner

*Primary Examiner*—Temesghen Ghebretinsae
(74) *Attorney, Agent, or Firm*—Ronald O. Neerings; W. James Brady, III; Frederick J. Telecky, Jr.

(57) ABSTRACT

A phase lock loop circuit 60 has a phase frequency detector 62, a charge pump 64, an active filter 87 and a voltage-controlled oscillator 100. The phase detector generates UP and DN signals indicative of the relative frequency of $F_R$, a reference signal, and $F_V$, a signal controlled by the voltage-controlled oscillator. A charge pump using logic gates (buffer 66 and inverter 68) to produce a voltage drop over resistors 74 and 84 to generate a voltage at a node coupled to the input of transmission gate 76 according to the values of the UP and DN signals. When the transmission gate 76 is closed (low impedance) the charge pump may sink or source current to the inverting input of the operational amplifier 86 of the active filter 86. When the transmission gate is open (high impedance state) the inverting input is electrically isolated from the node.

19 Claims, 5 Drawing Sheets

CHARGE PUMP PHASE LOCKED LOOP

CROSS-REFERENCE TO RELATED APPLICATIONS

Not Applicable

STATEMENT OF FEDERALLY SPONSORED RESEARCH OR DEVELOPMENT

Not Applicable

BACKGROUND OF THE INVENTION

1. Technical Field

This invention relates in general to electronic circuits and, more particularly, to phase locked loop circuits.

2. Description of the Related Art

A phase locked loop (PLL) synchronizes an output signal to a reference signal. Phase locked loops are used in a variety of electronic circuits for frequency synthesizing, frequency and phase modulation and demodulation, clock recovery and clock synchronization, among other uses.

FIG. 1a illustrates a basic diagram of a PLL. A phase frequency detector (PFD) 12 receives two signals, $F_R$, a reference signal, and $F_V$, a divided-down version of the output signal. The PFD generates UP and DN (down) signals, indicating whether the frequency of the output signal needs to increase (UP high) or decrease (DN high). The UP and DN signals are input into a loop filter 16. When UP is high and DN is low, $V_C$ rises, thereby increasing the frequency of the output of the VCO 18. Similarly, when DN is high and UP is low, $V_C$ falls, thereby decreasing the frequency of the output of the VCO 18. In many cases, a divider 20 is used to divide the frequency to a lower frequency by a factor of N; in this case $F_{out}=N*F_R$.

FIG. 1b illustrates a schematic diagram of a prior art active filter that may be used as the loop filter 16 in the PLL of FIG. 1a. The DN signal from the PFD 12 is coupled to the inverting input of operational amplifier (op-amp) 22, via resistor 24. The UP signal from the PFD 12 is coupled to the non-inverting input of op-amp 22 via resistor 26. The output of op-amp 22 is coupled to its inverting input via capacitor 28 and resistor 30. The non-inverting input is coupled to ground via resistor 32 and capacitor 34.

This type of filter is not often used in integrated applications, mainly because it requires a dual voltage supply and needs two tightly matched filters. Also, since both inverting and non-inverting inputs are driven by the PFD 12, this filter exhibits common mode problems.

FIG. 1c illustrates a schematic of a second active filter that may be used as the loop filter 16 in the PLL of FIG. 1a. The UP signal from the PFD 12 is coupled to the inverting input of operational amplifier (op-amp) 40, via resistor 42. The DN signal from the PFD 12 is coupled to the non-inverting input of op-amp 40 via resistor 44. The output of op-amp 40 is coupled to its inverting input via resistor 46. The non-inverting input of op-amp 40 is coupled to ground via resistor 48. The output of op-amp 40 is coupled to the inverting input of op-amp 50 via resistor 52. The output of op-amp 50 is coupled to its inverting input via capacitor 54 and resistor 56. The non-inverting output is coupled to a DC voltage, $V_{DC}$.

This design also is not particularly useful for integrated designs, since it requires two op-amps, which results in larger area requirements and higher noise and power consumption. Once again, matching the filters is difficult to achieve optimum performance. Also, op-amp 40 does not present a high impedance state to op-amp 50 and, thus, all of the noise from resistors 42, 46, 44 and 48 and PFD 12, and the DC mismatch between op-amp 50 and the inverting input of op-amp 50 will introduce spurs (feed-through).

A different type of PLL is the charge-pump phase locked loop (CP-PLL). A CP-PLL pumps current in and out of a loop filter in response to detected deviations between the output frequency and the reference frequency. Among other factors, CP-PLLs are considered superior with regard to frequency range and cost. However, these devices may be difficult to integrate onto silicon die, which is highly desirable in many applications.

A basic block diagram of a CP-PLL 58 is shown in FIG. 2. In this design, a phase frequency detector (PFD) 12 receives two signals, $F_R$, a reference signal, and $F_V$, a divided-down version of the output signal. The PFD 12 generates UP and DOWN pulses, indicating whether the frequency of the output signal needs to increase (UP pulsed) or decrease (DOWN pulsed). The UP and DOWN pulses cause a charge pump 14 to either source current into a loop filter 16 or sink current from the loop filter 16. As current is sourced to the loop filter 16, $V_C$ rises, thereby increasing the frequency of the output of the VCO 18. Similarly, as the charge pump 14 sinks current from the loop filter 16, $V_C$ falls, thereby decreasing the frequency of the output of the VCO 18.

The noise floor of a digital circuit and the noise current of the analog charge pump 14 represent the major noise contributors in a CP-PLL within the PLL bandwidth. In a traditional analog charge pump design used in CP-PLL applications, the noise contributions mainly come directly from the active devices used in the analog charge pump to sink and source current. In order to improve the signal-to-noise ratio, a higher reference current can be used in the charge pump; however, the higher reference current may necessitate a higher capacitor value in the loop filter 16, preventing a possible integration into a silicon die. In addition, mismatches between sink and source devices increase the spurious level that must be filtered out with a lower bandwidth filter (again requiring a larger capacitor) and a consequently longer settling time.

Another critical issue for the traditional charge pump is the need of a complex and low noise biasing circuit and the requirements in terms of supply headroom.

Therefore, a need has arisen for a compact charge-pump phase locked loop with low noise characteristics.

BRIEF SUMMARY OF THE INVENTION

In the present invention, a phase locked loop circuit comprises a phase detector, a charge pump for generating a charge on a node responsive to the output of the phase detector, an active filter for generating an output responsive to the charge on the node and a voltage controlled oscillator for generating an output frequency responsive to an output of said active filter. The charge pump includes a transmission gate for selectively providing a high impedance state between the node and the filter during inactive periods of the charge pump to electrically isolate the active filter from the charge pump.

In this aspect of the present invention, the added fast transmission gate at the charge pump output provides the advantages of: (1) when the charge-pump is active, the charging of the active filter with high linearity (with low spurious emission) and (2) when the charge-pump is in an inactive state, the electrical isolation of the active filter from the charge-pump itself (with low noise and low spurious emission).

In a second aspect of the present invention the charge pump is implemented using digital buffers and inverters with resistors. In this aspect of the present invention, the charge pump has a very low noise floor at active filter input. This structure does not require an extra op-amp (such as op-amp 40 in FIG. 1c) to make the difference between UP and DN signals, but the difference is directly done on inverted input of the op-amp used to implement the active filter.

The design of the phase locked loop of the present invention is amenable to integration on a semiconductor die, due to the small size of components used in the design.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which:

FIG. 1b is a schematic representation of a first embodiment of an active filter that can be used in the PLL of FIG. 1a;

FIG. 1c is a schematic representation of a second embodiment of an active filter that can be used in the PLL of FIG. 1a;

DETAILED DESCRIPTION OF THE INVENTION

The present invention is best understood in relation to FIGS. 3 through 5a–c of the drawings, like numerals being used for like elements of the various drawings.

Figure 1A:
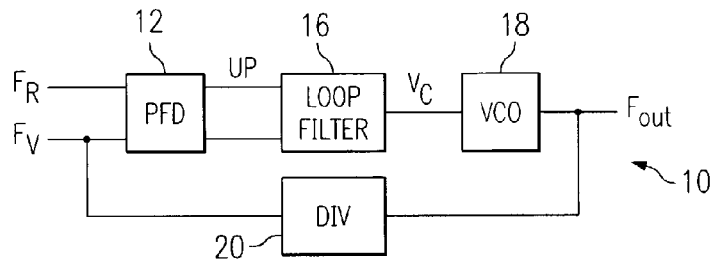
FIG. 1a is a block diagram of a prior art phase locked loop device.
Figure 1B:
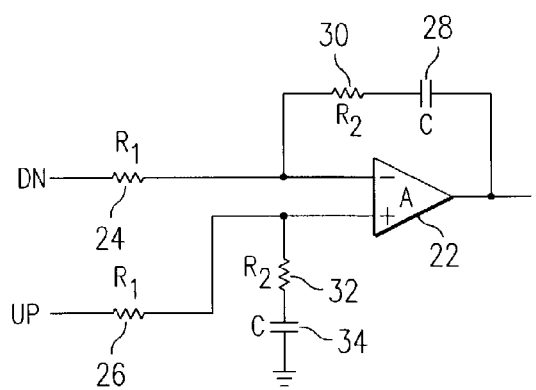
Figure 1C:
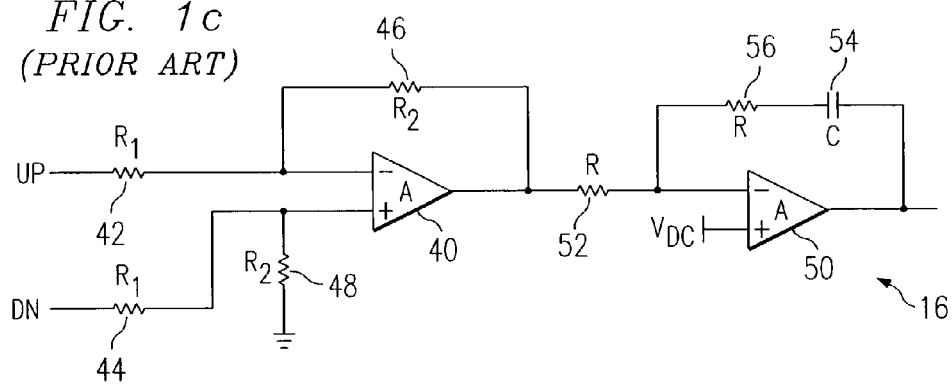
Figure 2:
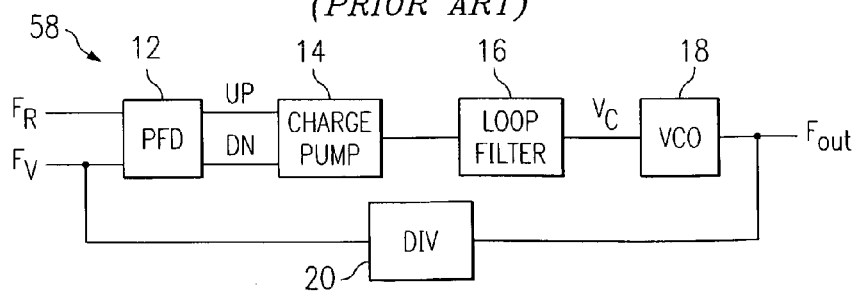
FIG. 2 is a block diagram of a prior art charge pump phased locked loop circuit.
Figure 3:
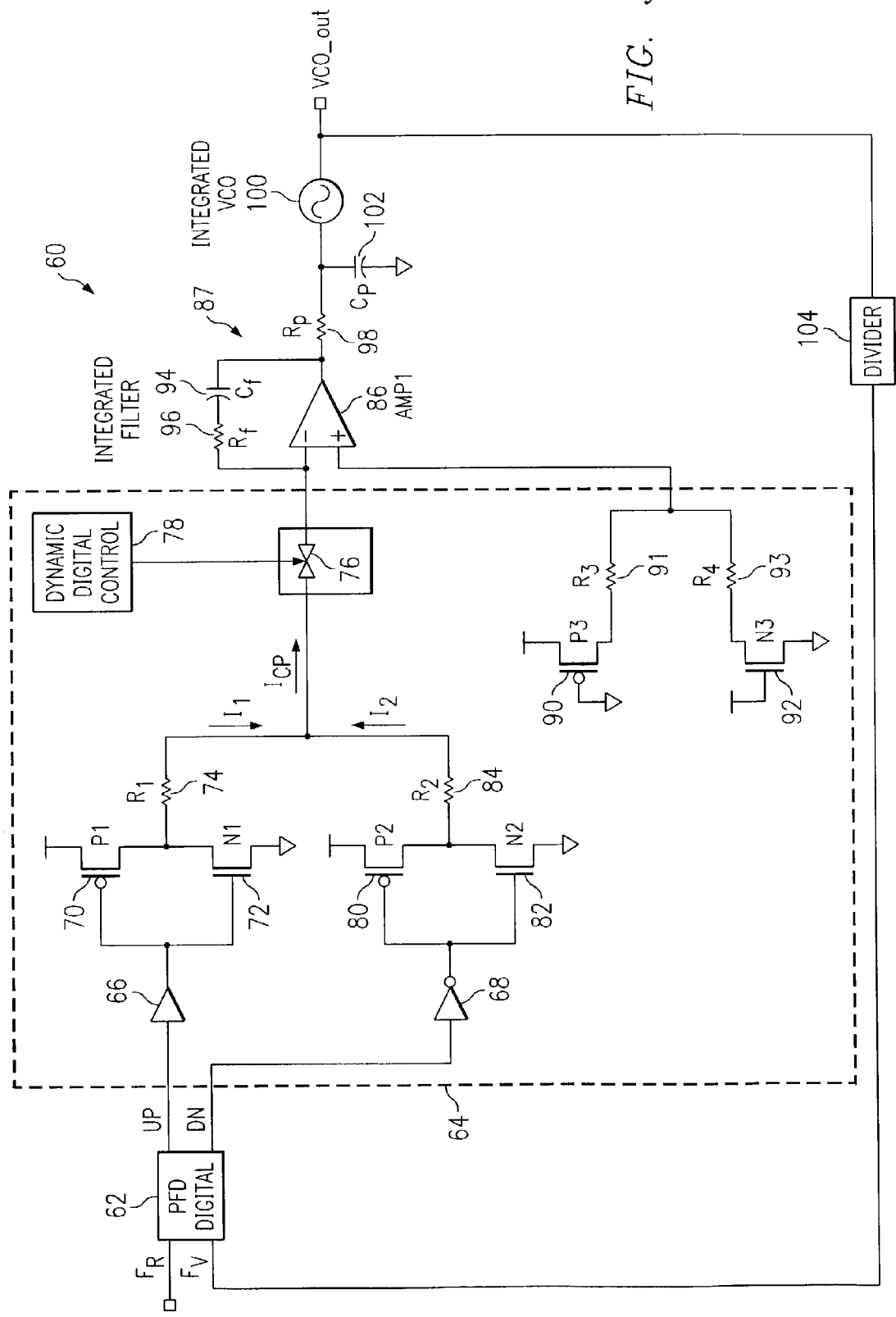
FIG. 3 is a partially block diagram, partially schematic diagram of a phase locked loop circuit with reduced noise and spurious emission characteristics that may be integrated into a semiconductor die.

FIG. 3 illustrates a schematic diagram of a PLL 60 that can be fully integrated on a semiconductor die, with low noise characteristics, low spur levels and high linearity. A reference signal $R_F$ is input to PFD 62. PFD 62 outputs UP and DN pulses to a digital charge pump 64. The UP node of PFD 62 is coupled to a non-inverting buffer 66 and the DN node of PFD 62 is coupled to an inverting buffer 68. The output of the non-inverting buffer 66 is coupled to both gates of p-channel transistor 70 and n-channel transistor 72 that produce a logical inversion of the signal at the gates of the transistors. A first source/drain of p-channel transistor 70 is coupled to $V_{DD}$ and a second source/drain of p-channel transistor 70 is coupled to a first source drain of n-channel transistor 72. The second source/drain of n-channel transistor 72 is coupled to ground. The node connecting the second source/drain of p-channel transistor 70 and the first source/drain of n-channel transistor 72 is coupled to a first terminal of resistor 74 (having resistive value R1). The second terminal of resistor 74 is coupled to the input of transmission gate 76. Transmission gate 76 is controlled by dynamic digital control 78.

The output of the inverting buffer 68 is coupled to both gates of p-channel transistor 80 and n-channel transistor 82 that produce another logical inversion. A first source/drain of p-channel transistor 80 is coupled to $V_{DD}$ and a second source/drain of p-channel transistor 80 is coupled to a first source drain of n-channel transistor 82. The second source/drain of n-channel transistor 82 is coupled to ground. The node connecting the second source/drain of p-channel transistor 80 and the first source/drain of n-channel transistor 82 is coupled to first terminal of resistor 84 (having resistive value R2). The second terminal of resistor 84 is also coupled to the input of transmission gate 76. The current through resistor 74 is designated as I1, the current through resistor 84 is designated as I2 and the current through transmission gate 76 to the inverting input of op-amp 86 is designated as Icp.

The output of transmission gate 76 is coupled to the inverting input of op-amp 86 of the active filter 87. The non-inverting input of op-amp 86 is coupled to a DC voltage source. This voltage source comprises p-channel transistor 90 and n-channel transistor 92. The gate of p-channel transistor 90 is coupled to ground and the gate of n-channel transistor 92 is coupled to $V_{DD}$. A first source/drain of p-channel transistor 90 is coupled to $V_{DD}$ and a second source/drain of p-channel transistor 90 is coupled to a first terminal of resistor 91. The first source/drain of n-channel transistor 92 is coupled to a first terminal of resistor 93. The second source/drain of n-channel transistor 92 is coupled to ground. The second terminals of resistors 91 and 93 are coupled to the non-inverting input of op-amp 86.

The output of op-amp 86 is coupled to its inverting input via capacitor 94 and resistor 96. The output of op-amp 86 is also coupled to a first terminal of resistor 98. The second terminal of resistor 98 is coupled to integrated VCO 100. A capacitor 102 is coupled between the input to VCO 100 and ground. The output of VCO 100 is input to divider 104. The output of divider 104 ($F_V$) is coupled to PFD 62.

The value of the resistors is designed such that R1=R2=n*R3=n*R4. Since R1 will be proximate R2 and R3 will be proximate R4, the matching of the ratios should be highly accurate, even in the face of process variations (better than 1% matching using standard processing techniques). In operation, non-inverting buffer 66 and inverter 68 operate to sink or source current to the inverting input of op-amp 86 as follows. Assuming transmission gate 76 is open (i.e. in a high impedance state), if UP and DN are both high, resistors 84 and 74 will be series connected between $V_{DD}$ and ground. If UP and DN are both low, resistors 74 and 84 will be series connected between $V_{DD}$ and ground. In either case, no current will be sourced to or drawn from the inverting node. Assuming transmission gate 76 is closed (i.e. in a low impedance state) if UP and DN are both high, resistors 84 and 74 will be series connected between $V_{DD}$ and ground. If UP and DN are both low, resistors 74 and 84 will be series connected between $V_{DD}$ and ground. In either case, no current will be sourced to or drawn from the inverting node due to the matching between the ratio R1/R2 and R3/R4.

If UP is high and DN is low, resistor 74 will be between ground and the inverting input and resistor 84 will be between the ground and the inverting input. As a result, current will sink from the inverting input and the voltage output of the active filter will increase. Accordingly, the frequency output from the VCO 100 will increase.

On the other hand, if UP is low and DN is high, resistor 74 will be between $V_{DD}$ and the inverting input and resistor

84 will be between $V_{DD}$ and the inverting input. As a result, current will be drawn to the inverting input and the voltage output of the active filter will decrease. Therefore, the frequency output from the VCO 100 will decrease.

The operation of the present invention, as described thus far, greatly improves on the noise characteristics in the prior art. With the traditional analog charge pump used for an integrated PLL, the noise contribution comes largely from the active devices used in the analog charge pump itself and from the mismatch between sinking and sourcing devices. The noise floor in the PLL bandwidth of the prior art PLL is limited by the analog charge pump. The charge pump uses large transistors and works with relatively high current in order to improve the signal-to-noise ratio.

In the explanation above, it is assumed that the transmission gate 76 is open. The transmission gate 76, under control of dynamic digital control 78, is used in the preferred embodiment to provide additional digital noise filtering. The dynamic digital control circuitry 78 operates responsive to the UP and DN signals to isolate the inverting input of op-amp 86 from the rest of the circuitry during time periods when the charge pump 64 should not be sinking or sourcing current into the inverting input. Specifically, the dynamic digital control circuit 78 provides a current path to the inverting input from a time period just before either the UP or DN signals transition to an active voltage level and isolates the inverting input just after the UP or DN signal transition to an inactive voltage level (although exact timing of the opening and closing of the transmission gate 76 is generally not critical). In this way, much of the noise due to the power supply and the resistors is decoupled from the inverting input, causing a reduction in the digital noise floor and the spurs due to any slight voltage mismatch between the inverting and non-inverting inputs.

Because of the attenuation of noise, the resistance value of R1, R2, R3 and R4 may be increased, with low impact on the phase noise (up to the level it is negligible compared to the input noise of the op-amp 86), with the consequential reduction of the charge pump current in such a way as to allow reduction of the capacitance of capacitor 94. With a smaller capacitance, it may be possible to integrate this capacitor onto the silicon die with the rest of the PLL.

Figure 4:
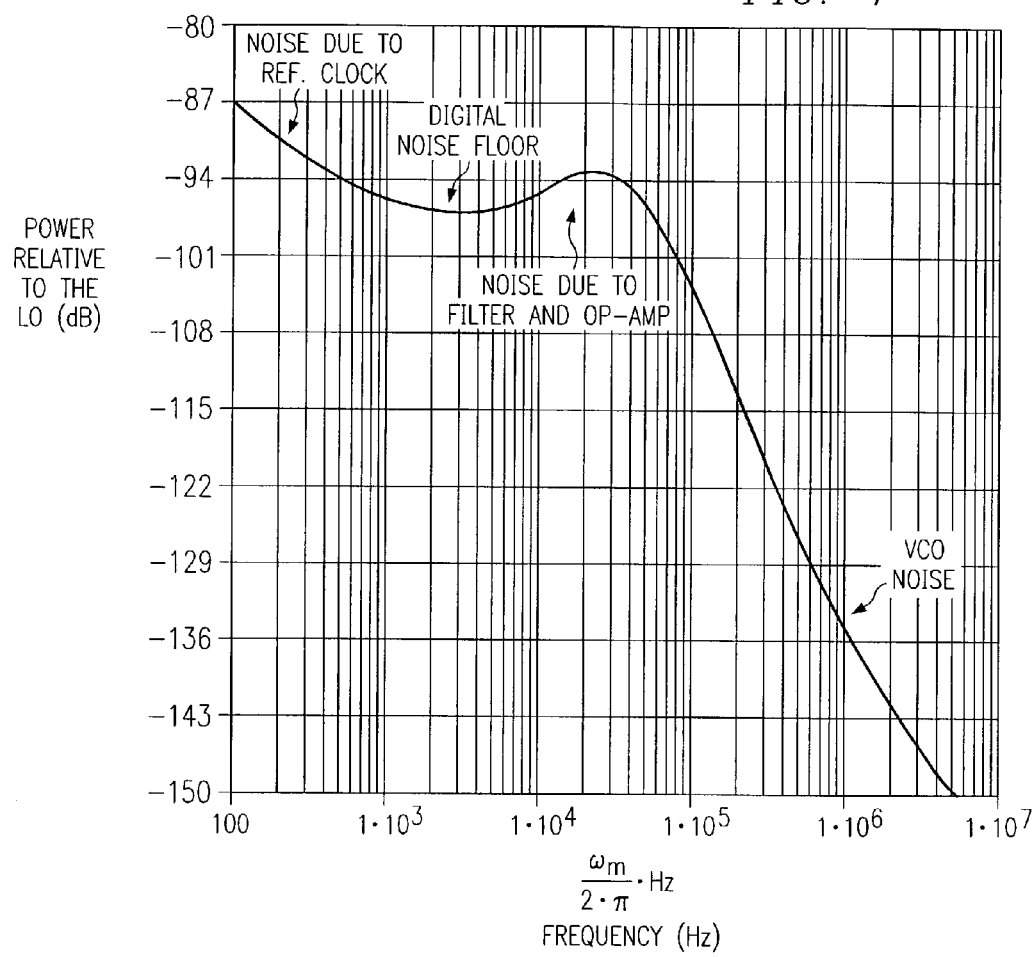
FIG. 4 is a graph showing noise contributors.

FIG. 4 illustrates the phase noise contributors for the embodiment shown in FIG. 3. The noise is dominated by the reference clock $F_R$ phase noise for low frequency offset (frequency<1 kHz) by the digital noise floor in the close-in bandwidth (as shown, the PLL exhibits a very low noise floor), by the filter and the op-amp 86 at the limit of the PLL loop bandwidth, and by the VCO noise over the PLL loop bandwidth.

The advantage of the embodiment of FIG. 3 is that the active device (op-amp 86) has a relatively low effect on noise contribution because it contributes only at the limit of the bandwidth like the filter contributors (resistors 96 and 98), an op-amp with standard characteristics is sufficient to reach high performance levels. Resistors 91 and 93 have a very low effect on noise contribution because they are connected to the non-inverting input of op-amp 86 and thus have a unity gain. Resistors 74 and 84, the inverter/non-inverting buffers 68 and 66, and the PFD 62 contribute to the close-in noise floor of the PLL, with very low level of noise due to two reasons: (1) the input current to the op-amp 86 is not generated by active current generators, but rather by resistors 74 and 84 and gates (i.e., inverter/non-inverting buffers 68 and 66), which generate minimal noise and (2) the transmission gate 76 provides a high impedance state with fast switching characteristics, which isolates the op-amp 86 from the digital inverter/non-inverting buffers 68 and 66 and the resistors 74 and 84 for the vast majority of the time and make the op-amp 86 working as a follower.

Figure 5A:
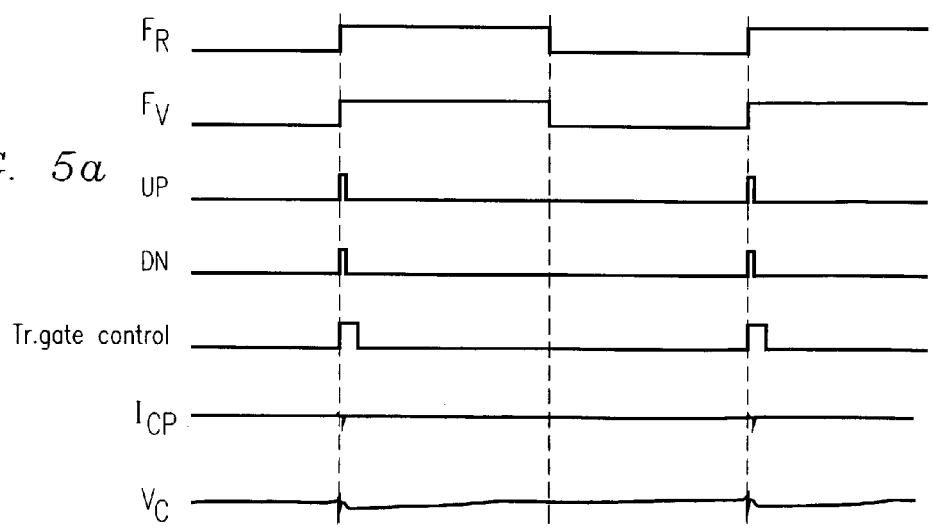
FIGS. 5a through 5c are timing diagrams showing noise levels and the operation of a dynamically controlled transmission gate to block noise.
Figure 5B:
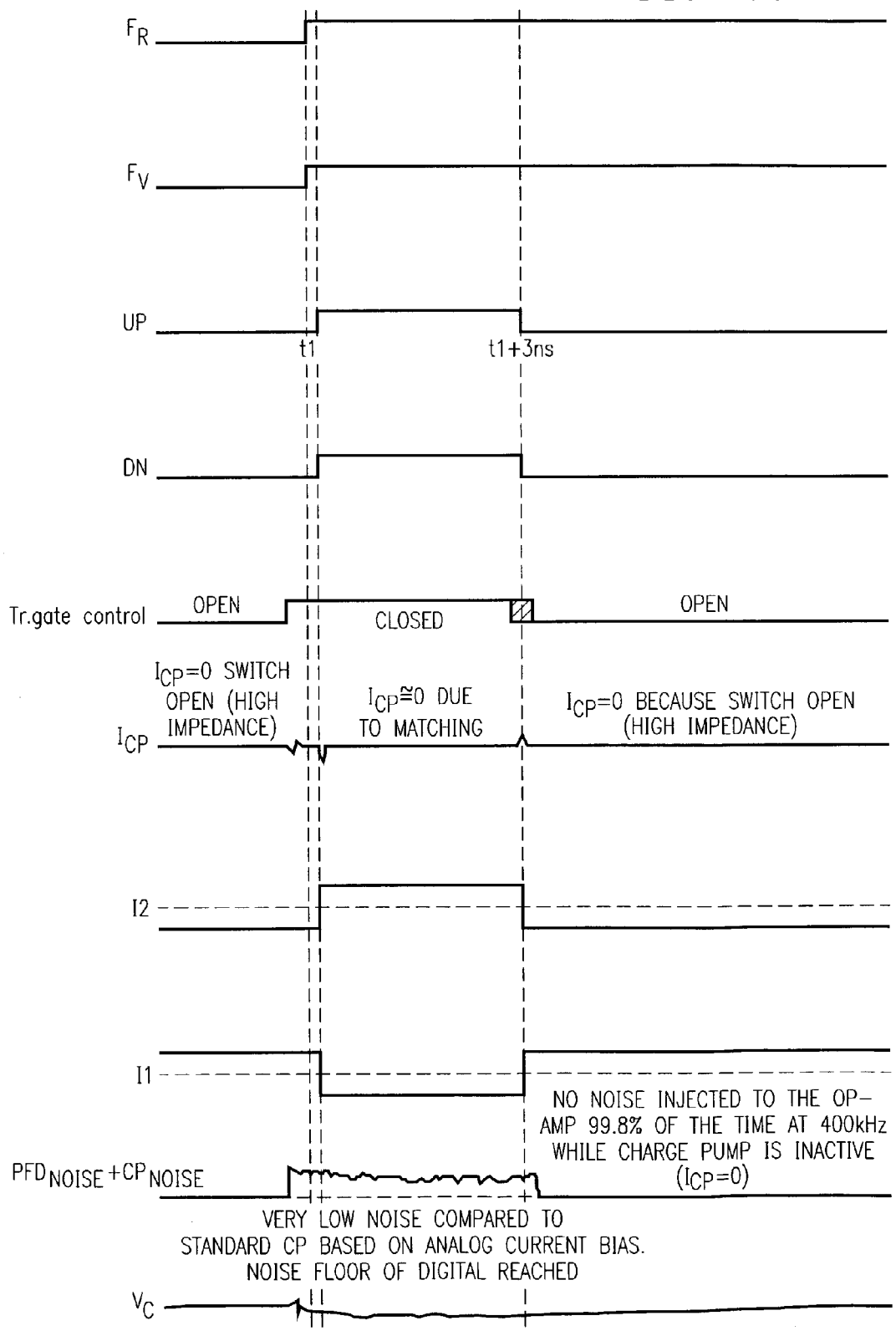
Figure 5C:
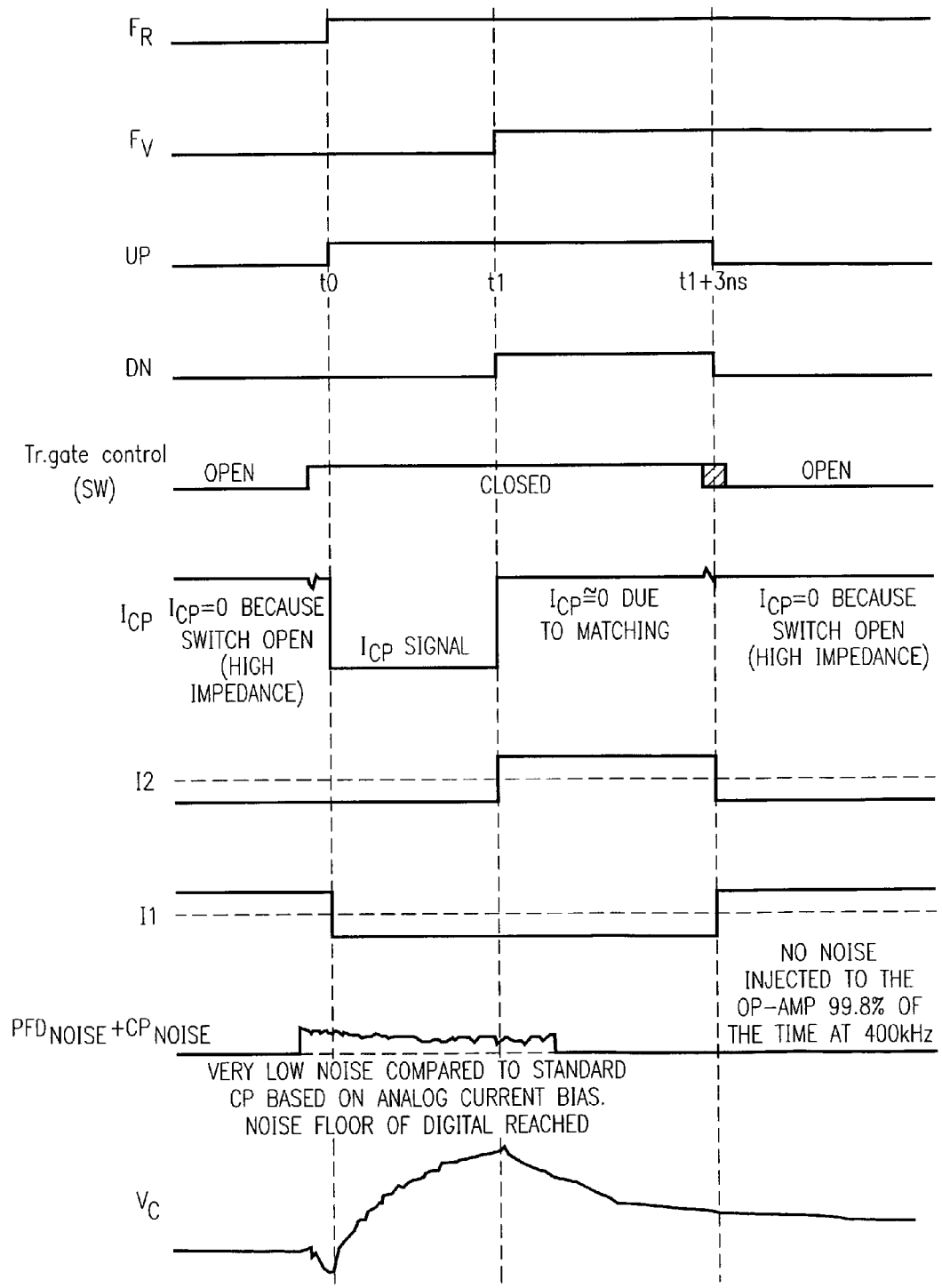

FIGS. 5*a–c* better illustrate the benefits of the high impedance state provided by the transmission gate 76. FIG. 5*a* illustrates the generally low noise and spur characteristics of the PLL 60. As can be seen in FIGS. 5*b* and 5*c* the UP signal transitions high responsive to an upward transition of the $F_R$ reference and the DN signal transitions high responsive to an upward transition of the $F_V$ signal. The UP and ON signal overlap for 3ns before both transitioning to a low voltage state. By providing a high impedance at transmission gate 76 the digital charge pump 64 is electrically isolated from the op-amp 86 for all time other than the period where UP or DN signal is at an active logic level—for a 400 KHz example as shown in FIG. 5*b*, the transmission gate is in a high impedance state for (2.5µs-3ns)/2.5µs or 99.88% of the time (when in a locked state). The dynamically-controlled transmission switch 76 greatly improves the signal-to-noise ratio, because it allows the complete signal from the charge pump 64 to charge the filter with high linearity during the time the transmission switch is in a low impedance state due to the fast switching of the gates (inverter/non-inverting buffers 68 and 66) and the speed of the transmission switch 76, without a dead-zone, and it isolates noise from entering the op-amp 86 during the remainder of the time.

The noise and spurious performance are related to the matching between the p-channel transistors 70, 80 and 90, between the n-channel transistors 72, 82, and 92, between the ratios R1/R2 and R3/R4 of resistors 74, 84, 91 and 93. Accordingly, the devices that must be matched are similar devices (rather than complementary devices) and a better dynamic matching behavior can be achieved. Thus, mismatching of components has a negligible effect on noise in this structure. Whatever noise is generated through mismatching is largely isolated from propagation to the op-amp 86 due to the transmission switch, which is normally in a high impedance state. The op-amp is in follower mode during the high impedance state and cannot integrate any mismatch or offset error. Additionally, no biasing blocks are needed, as in prior art charge pump devices, minimizing the size of the analog section. Also, a DC voltage is applied to the non-inverting input of op-amp 86, eliminating common mode problems.

A standard analog current source charge pump, on the other hand, needs an overlap time between UP and DN signals that is relatively big, on the order of 10 ns for a 400 kHz reference signal, as compared to the 3 ns signal required by the present invention (also for a 400 kHz reference signal). This is due to the difficulty of the analog charge pump to cut the current source and it needs time to settle, as opposed to fast switching gates. Additionally, the setting of the current on a p-type source is difficult to match with an n-type source; therefore a certain time period is required to allow the output to null the charge at the filter when the signal is locked without generating excessive spurs due to the mismatch on the current spikes generated by cutting the current source. The large overlap time requirement degrades the noise performance of the standard approach.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the claims.

What is claimed is:

1. A phase locked loop circuit, comprising:
a phase detector receiving two clock signals and outputting a control signal indicative of a frequency mismatch between the two clock signals;
an active filter for generating an output responsive to a change on an input node;
a charge pump sinking or sourcing current to the input node responsive to the control signal from said phase detector;
a voltage controlled oscillator for generating an output frequency responsive to an output of said active filter; and
wherein said charge pump includes:
a transmission gate for selectively providing either a high impedance state to prevent the charge pump from charging the input node or a low impedance state to allow the charge pump to charge the input node; and
control circuitry for controlling the state of the transmission gate responsive to the control signal such that the transmission gate is in a high impedance state to electrically isolate the charge pump from said filter during periods when the control signal is inactive and not causing the charge pump to sink or source current to the input node.

2. The phase locked loop circuit of claim 1 wherein said phase detector is coupled to a first clock signal having a known frequency and to a second clock signal having a frequency controlled by said voltage controlled oscillator.

3. The phase locked loop circuit of claim 2 wherein said control signal comprises a pair of control signals indicative of the relative frequencies of said first and second clock signals, wherein a first control signal indicates an active edge transition of said first clock signal and a second control signal indicates an active edge transition of the second clock signal.

4. The phase locked loop circuit of claim 3 where said charge pump includes a first gate coupled to said first control signal and a second gate coupled to said second control signal.

5. The phase locked loop circuit of claim 4 wherein said first gate is a non-inverting buffer and said second gate is an inverter.

6. The phase locked loop circuit of claim 4 and further comprising a first resistor coupled between an output of said first gate and said node and a second resistor coupled between an output of said second gate and said node.

7. The phase locked loop circuit of claim 6 and further comprising a first inverter coupled between the output of said first gate and said first resistor and a second inverter coupled between the output of said second gate and said second resistor.

8. The phase locked loop circuit of claim 1 wherein said active filter includes an operational amplifier having an inverting input coupled to said transmission gate.

9. The phase locked loop circuit of claim 8 wherein said operational amplifier has a non-inverting input coupled to a predetermined voltage.

10. The phase locked loop circuit of claim 9 wherein said predetermined voltage is generated through a first resistor coupled between a first predetermined voltage and said non-inverting input and a second resistor coupled between a second predetermined voltage and said non-inverting input.

11. The phase locked loop circuit of claim 3 wherein said control circuitry places the transmission gate in a low impedance state only during the time periods when one or both of the first and second control signals is in an active state.

12. A phase locked loop circuit, comprising:
a phase detector receiving first and second clock signals and generating first and second control signals indicative of the relative frequencies of said first and second clock signals;
an active filter for generating an output responsive to said charge on an input node;
a charge pump for generating a charge on the input node responsive to the output of said phase detector, said charge pump comprising first and second logical gates for receiving respective first and second control signals from said phase detector, said first and second logical gates having outputs for charging the node while the first and second control signals are active, and a transmission gate for selectively providing a high impedance state to prevent the charge pump from sinking or sourcing current to the input node during inactive periods of said charge pump to electrically isolate the charge pump from said filter; and
a voltage controlled oscillator for generating an output frequency responsive to an output of said active filter.

13. The phase locked loop circuit of claim 12, where said charge pump further includes first and second resistors coupled to said gates.

14. The phase locked loop circuit of claim 13 wherein said charge pump further comprises a first inverter coupled between the output of said first gate and said first resistor and a second inverter coupled between the output of said second gate and said second resistor.

15. The phase locked loop circuit of claim 13 wherein said first and second resistors have the same resistive value.

16. The phase locked loop circuit of claim 13 wherein said active filter includes an operational amplifier having an inverting input coupled to said transmission gate.

17. The phase locked loop circuit of claim 16 wherein said operational amplifier has a non-inverting input coupled to a predetermined voltage source.

18. The phase locked loop circuit of claim 17 wherein said predetermined voltage source comprises a third resistor coupled between a first predetermined voltage and said non-inverting input and a fourth resistor coupled between a second predetermined voltage and said non-inverting input.

19. The phase locked loop circuit of claim 18 wherein the ratio of resistive values between said first and second resistors is the same as the ratio of resistive values between said third and fourth resistors.

* * * * *